United States Patent

Brennan et al.

[11] Patent Number: 6,060,389
[45] Date of Patent: May 9, 2000

[54] SEMICONDUCTOR FABRICATION EMPLOYING A CONFORMAL LAYER OF CVD DEPOSITED TIN AT THE PERIPHERY OF AN INTERCONNECT

[75] Inventors: William S. Brennan; Frederick N. Hause, both of Austin, Tex.

[73] Assignee: Advanced Micro Devices, Inc., Sunnyvale, Calif.

[21] Appl. No.: 09/075,596

[22] Filed: May 11, 1998

[51] Int. Cl.⁷ .................................................. H01L 21/4763
[52] U.S. Cl. ..................... 438/643; 438/680; 438/681; 438/683; 438/685
[58] Field of Search .................................. 438/653, 656, 438/643, 657, 664, 629, 683, 680, 681, 685

[56] References Cited

U.S. PATENT DOCUMENTS

| | | | |
|---|---|---|---|
| 5,432,104 | 7/1995 | Sato | 438/230 |
| 5,620,919 | 4/1997 | Godinho et al. | 438/230 |
| 5,717,250 | 2/1998 | Schuele et al. | 257/48 |
| 5,723,382 | 3/1998 | Sandhu et al. | 438/653 |
| 5,780,351 | 7/1998 | Arita et al. | 438/396 |

OTHER PUBLICATIONS

Musher et al., "Atmospheric pressure chemical vapor deposition of TiN from tetrakis (dimethylamido) titanium and ammonia," *J. Mater. Res.*, vol. 11, No. 4, Apr. 1996, pp. 989–1001.

Kim et al., "Stability of TiN Films Prepared by Chemical Vapor Deposition Using Tetrakis–dimethylamino Titanium," *J. Electrochem. Soc.*, vol. 143, No. 9, Sep. 1996, pp. L188–L190.

Raaijmakers, "Low temperature metal—organic chemical vapor deposition of advanced barrier layers for the microelectronics industry," *Thin Solid Films*, 247 (1994), pp. 85–93.

*Primary Examiner*—David Nelms
*Assistant Examiner*—Reneé R. Berry
*Attorney, Agent, or Firm*—Kevin L. Daffer; Conley, Rose & Tayon

[57] ABSTRACT

A method for forming a local interconnect coupled to an active area of a semiconductor substrate is provided. The method comprises etching a local interconnect trench into an interlevel dielectric horizontally above the substrate. A titanium layer may be deposited across the semiconductor topography. A TiN diffusion layer is advantageously CVD deposited across the exposed surfaces of the titanium layer. A plasma containing $N_2$ and $H_2$ ions is used to bombard the surface of the TiN layer. The resulting TiN layer is conformal and has a low resistivity. A tungsten fill material is then deposited upon the TiN layer to a level above the dielectric. The tungsten adheres well to the TiN layer and is substantially free of voids. The TiN and the tungsten may be removed down to level commensurate with the surface of the dielectric. In this manner a local interconnect is formed electrically coupled to the active area.

20 Claims, 6 Drawing Sheets

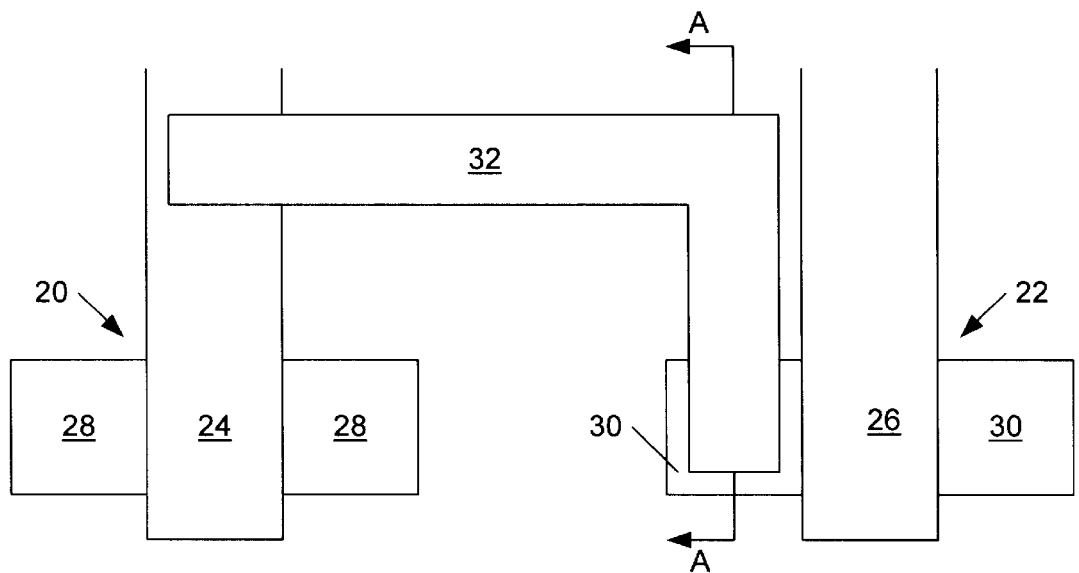
FIG. 2
(PRIOR ART)
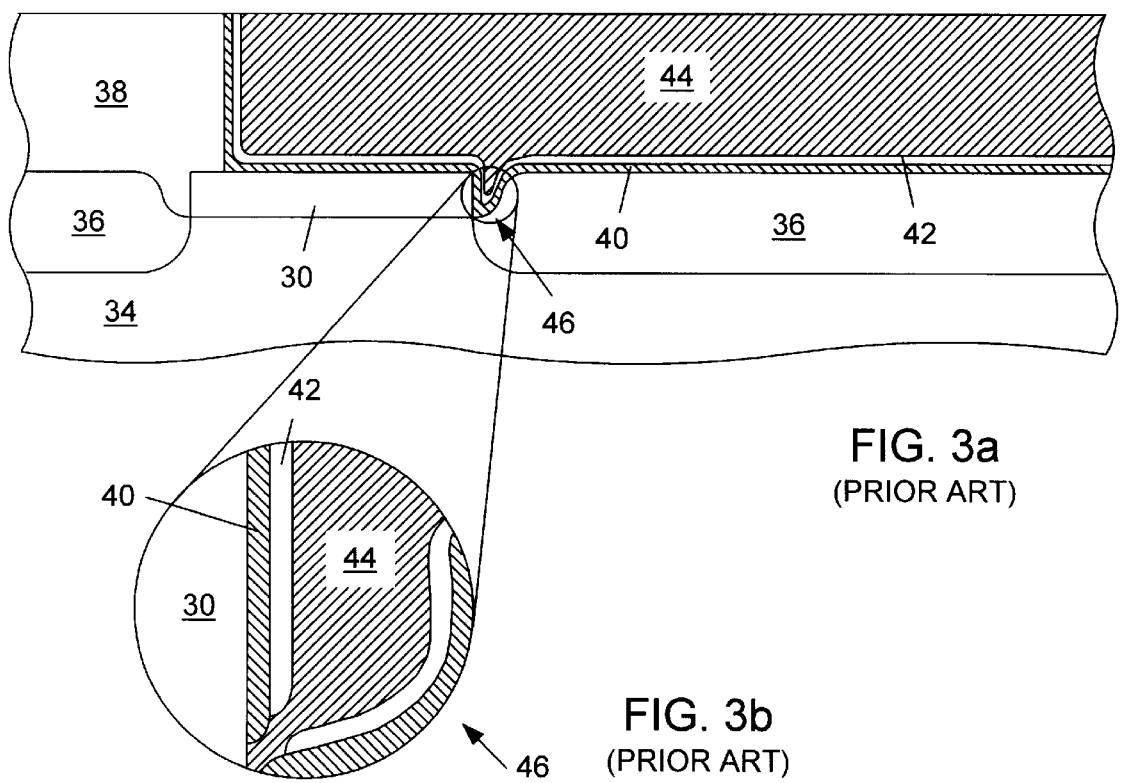
FIG. 3a
(PRIOR ART)
FIG. 3b
(PRIOR ART)

6,060,389

SEMICONDUCTOR FABRICATION EMPLOYING A CONFORMAL LAYER OF CVD DEPOSITED TIN AT THE PERIPHERY OF AN INTERCONNECT

BACKGROUND OF THE INVENTION

1. Field of the Invention

This invention relates to integrated circuit fabrication and, more particularly, to a TiN barrier layer which is uniformly deposited by chemical-vapor deposition across the exposed surfaces of a trench into which an interconnect is to be formed.

2. Description of the Relevant Art

Fabrication of an integrated circuit involves numerous processing steps. After impurity regions have been deposited within a semiconductor substrate and gate areas defined upon the substrate, interconnect routing is placed on the semiconductor topography and connected to contact areas thereon to form an integrated circuit. The entire process of making an ohmic contact to the contact areas and routing interconnect material between ohmic contacts is described generally as "metallization". While materials other than metals are often used, the term metallization is generic in its application. It is derived from the origins of interconnect technology, where metals were the first conductors used. As the complexity of integrated circuits has increased, the complexity of the metallization structure has also increased.

Building multi-level interconnect structures is well known in the art. Multi-level interconnect structures were developed in response to the shrinkage of active devices combined with increased demands required to accommodate interconnect routed between the active devices. In many designs, the area required to route a level of interconnect exceeds the area occupied by the active devices. Multi-level interconnect technology has therefore gained in popularity. Interconnect dispersed across several elevational levels helps reduce the overall lateral area occupied by the interconnect—leading to an increase in integrated circuit packing density.

Local interconnects are a special form of interconnect. Local interconnects are relatively short routing structures, and can be made of numerous conductive elements. A popular local interconnect comprises doped polysilicon, or reacted polysilicon termed "polycide". In whatever form, local interconnects are beneficial to the formation of multi-level interconnect structures. Contact of a local interconnect to the underlying silicon substrate is typically made by forming a trench through an interposed dielectric down to the underlying substrate. A conductive material may be deposited into the trench to form a local interconnect across the substrate which is isolated everywhere else. Local interconnects, when covered with a dielectric, permit "global" interconnect to extend in an unrestricted manner a dielectric-spaced distance over the local interconnects and buried contacts. Local interconnects are not as universal as global interconnects for various reasons. First, a local interconnect cannot cross over regions where a transistor gate exists without making a contact to the gate. Second, local interconnects are typically composed of a material which has a resistivity higher than that from which global interconnects (e.g., aluminum) are formed.

Local interconnect can be used to provide coupling between a gate of a MOS transistor and a source or drain active area (hereinafter "junction") of that transistor. Such coupling effectuates a diode. Local interconnect has also been used to couple a gate of one transistor and a source or drain junction of another transistor. This form of coupling is prevalent in, for example, high density VLSI logic and SRAMs. An SRAM cell layout can be substantially reduced when a local interconnect level and associated buried contacts are used.

FIG. 1 illustrates an exemplary SRAM cell 10 which includes a pair of cross-coupled transistors 12 and a pair of access transistors 14. The drain junction of each transistor 14 is coupled to the gate of one of the transistors 12 via a local interconnect. Application of a word bit (W0 and W1) will force the output from transistors 12 to undergo a change in state when a sufficient voltage magnitude and duration of bit input (B0 or B1) exists. SRAM cells include several devices (four are shown) which somewhat limit the packing density of these cells. However, as SRAMs have evolved, they have undergone an increase in density mostly due to the use of smaller line widths. Density improvements have also been made by using, for example, local interconnects, and poly load resistors in lieu of devices. SRAM cell 10 has four devices and two poly load resistors 16. In such a four-transistor cell having two poly load resistors, there are no P-channel devices, so no N-channel-to-P-channel isolation is needed. Advantageously, the local interconnects function as gate-to-drain interconnect structures.

FIG. 2 depicts a partial top plan view of an exemplary integrated circuit employing such a local interconnect. A pair of transistors 20 and 22 are arranged a lateral spaced distance apart upon and within a substrate. Transistors 20 and 22 comprise respective gate conductors 24 and 26 interposed between respective source/drain junctions 28 and 30. Those source/drain junctions 28 and 30 are isolated from each other by field regions (e.g., shallow trench isolation structures) formed within the substrate. A local interconnect 32 extends across the substrate from gate conductor 24 of transistor 20 to one source/drain junction 30 of transistor 22. The local interconnect 32 is oriented such that it does not pass over source/drain junctions 28 and cause unwanted shorting between gate conductor 24 and source/drain junctions 28.

FIG. 3a illustrates a cross-sectional view along plane A—A of the integrated circuit depicted in FIG. 2. Source/drain junction 30 is arranged within a semiconductor substrate 34 comprising single crystalline silicon. Source/drain junction 30 has been implanted with a dopant species opposite in type to the dopant species residing within the bulk of substrate 34. A silicide structure may be formed upon source/drain junction 30 to lower the contact resistance to the junction. Trench isolation structures 36 comprising, e.g., silicon dioxide ("oxide") are arranged on opposite sides of source/drain junction 30 within substrate 34. The upper surface of each trench isolation structure 36 includes a recessed region directly adjacent source/drain junction 30, and thereby exposes a lateral edge of the junction. The formation of such a recessed region in the upper surface of a trench isolation structure is well-known in the semiconductor industry. It is believed that the recessed region results from overetching layers of material patterned upon the substrate, thereby removing the field oxide underlying those layers of material. As shown in FIG. 3a, a titanium (Ti) layer 40 and a titanium nitride (TiN) layer 42 are arranged at the periphery of local interconnect 44. Local interconnect 44 is laterally isolated from other conductive structures of the integrated circuit by an interlevel dielectric 38.

Turning to FIG. 3b, a detailed view along section 46 of FIG. 3a is shown in which the topological surface includes a recessed region. The lateral edge of source/drain region 30, not being covered with trench isolation structure 36, is partially coated with Ti layer 40 and TiN layer 42. Sputter etch may be used to clean the exposed silicon/silicide and oxide surfaces prior to receiving Ti layer 40. Conventional methods of local interconnect formation involve physical vapor deposition ("PVD") of Ti and TiN onto exposed surfaces, followed by deposition of a conductive material, such as tungsten (W) upon the TiN. PVD of Ti and TiN may be accomplished by, e.g., reactive sputtering a titanium target in an inert ambient such as argon or $N_2$. Ti layer 40 and TiN layer 42 together serve as a diffusion barrier to cross-diffusion at the interconnect 44/junction 30 interface. TIN is a popular diffusion barrier because it exhibits good electrical conductivity, chemical inertness, and strong atomic bonds. Such cross-diffusion, if not prevented, could lead to problems such as the formation of a conductive path through junction 30, i.e., "junction spiking", which provides undue leakage or renders transistor 22 inoperable. Ti layer 40 combined with TiN layer 42 also provide an adhesion/nucleation layer between the tungsten within interconnect 44 and the sidewalls of interlevel dielectric 38.

Unfortunately, several problems are associated with lining the recessed region of the semiconductor topography with Ti layer 40 and TiN layer 42 which are formed by conventional PVD. Since PVD is a line-of-sight process in which deposition is directional and occurs on the first encountered surface, the step coverage of TiN layer 42 is dependent on the orientation of the topological features to the dielectrically induced deposition material. Dependency on the orientation is often referred to as a "collimated" deposition in that columns of deposited material accumulate generally perpendicular to horizontally oriented topological surfaces. Unfortunately, vertical surfaces, due to their orientation, cannot receive collimated deposition materials. Thus, the lateral sidewall of source/drain junction 30 receive minimal and non-continuous PVD Ti and TiN. The Ti and TiN that enters the narrow recess region strikes the upper portions of the vertically oriented surfaces of source/drain junction 30 and the recessed region of trench isolation structure 36 before reaching the lower portions of those surfaces.

As shown, lower portions of the lateral sidewall of source/drain junction 30 and of the recessed region of isolation structure 36 may receive very little Ti and TiN, and thus remain exposed after the PVD of Ti layer 40 and TiN layer 42. As such, during the chemical-vapor deposition ("CVD") of W fill material 44 (i.e., local interconnect 44) from a gas comprising $SiH_4$ and $WF_6$ or $WF_4$, a F radical attacks the exposed Si and $SiO_2$ surfaces not sufficiently coated with Ti layer 40 and TiN layer 42, most likely forming a SiF layer. The amount of $WF_6$ available to react with $SiH_4$ to form W is thus significantly reduced at those surfaces covered by SiF layer. At the surfaces lined with Ti layer 40 and TiN layer 42, however, cross-diffusion between the silicon atoms and the fluorine atoms is reduced, making SiF formation less likely. Absent, an adequate diffusion barrier at those lower portions of the lateral sidewall of source/drain junction 30 and the recess region of isolation structure 36, W atoms might undesirably migrate into source/drain junction 30 and isolation structure 36 in subsequent processing steps.

In addition, TiN layer 42 may inadequately cover the lower portions of Ti layer 40. Thus, as W is PVD deposited into the recessed region, a F radical arising from either $WF_6$ or $WF_4$ may attack the exposed portions of Ti layer 40, thereby forming TiF. Unfortunately, TiF exhibits a relatively high resistivity which is greater than that of the combination of Ti layer 40 and TiN layer 42. Thus, the formation of TiF may unduly add to the contact resistance between junction 30 and W fill material 44. Furthermore, if $TiSi_2$ exists upon source/drain junction 30, $WF_6$ might penetrate to and react with the $TiSi_2$. Consequently, non-continuous regions of TiF mighty be created in the salicide (i.e., $TiSi_2$) structure, leading to highly resistive transistors and contact structures.

Another problem related to using PVD to form Ti layer 40 and TiN layer 42 is that these layers may become delaminated from the surfaces upon which they are formed if they are too thin or if TiF and/or SiF are formed. Collimation of Ti layer 40 and TiN layer 42 provides diffusion pathways at the grain boundaries between each "column" of the structure. As a result, silicon in the adjacent junction 30 may migrate into W fill material 44, leaving behind voids or pits into which W may diffuse. In addition, the PVD Ti and TiN columnar microstructure grains may form diffusion pathways through the thin barrier layer to further aggravate the TiF and SiF problem. Consequently, the W may accumulate such that it extends through junction 30 to bulk substrate 34, resulting in junction spiking or leakage.

It would therefore be desirable to develop a technique for forming a local interconnect which is lined with a substantially conformal barrier layer. A barrier layer which exhibits good step coverage on the sidewalls and base of a narrow recessed region is necessary to prevent cross-diffusion of atoms between the local interconnect and e.g., an adjacent junction. Further, lining the local interconnect with a barrier layer of uniform thickness will prevent the formation of voids in the ensuing conductive fill material of the local interconnect. Good adhesion between the fill material and the barrier layer is also necessary. Yet further, it would beneficial to form a barrier layer which is not collimated at the perimeter of a local interconnect. Instead, the barrier layer should have a somewhat amorphous grain structure. Undesirable occurrences, such as junction spiking/leakage and increased contact resolution would be less likely in an integrated circuit employing a local interconnect having such a barrier layer at its periphery.

SUMMARY OF THE INVENTION

The problems outlined above are in large part solved by the technique hereof for chemically-vapor depositing a TiN layer upon the sidewalls and the base of a trench. The trench is formed through a dielectric down to an underlying etch stop layer residing upon a semiconductor substrate. The etch stop layer is then stripped, exposing the underlying substrate. A junction arranged within the substrate laterally adjacent a field oxide region may also be exposed during the trench formation. The upper surface of the field oxide region immediately adjacent the junction may be recessed below the upper surface of the junction. This "recessed region" of the topological surface may have a relatively high-aspect ratio. The contact opening is cleaned using various techniques (e.g., sputter etch) prior to depositing a Ti layer and a TiN layer across the semiconductor topography. Low pressure chemical vapor deposition ("LPCVD") of the TiN may be performed from a tetrakis(dimethylamino)Ti (Ti[N (CH$_3$)$_2$]$_4$) source. The pressure, temperature and plasma treatment at which the LPCVD of TiN occurs is controlled to promote the formation of a conformal, low resistive TiN layer upon the surfaces bounding the trench.

The resulting TiN layer advantageously exhibits good step coverage, uniform thickness and amorphous grain structures at the periphery of the recess region. Because the TiN layer is conformally arranged upon all surfaces bounding the recess region, a void-free conductive fill material, e.g., tungsten, which is absent of seams may be CVD deposited into the trench, and even the recess region. Further, because of the relatively strong bonds between titanium atoms and nitrogen atoms, and the amorphous grain structures of the LPCVD TiN, the TiN layer serves as a good diffusion barrier. Thus, cross-diffusion between W, Si, and Ti atoms at the substrate/interconnect interface is prevented. Moreover, since adhesion between TiN and W is strong, the TiN layer forms a glue-like layer between the W and adjacent structures. Yet further, TiN deposited using CVD is neither delaminated nor collimated. Thus, the thickness of the TiN layer may be reduced since grain boundaries which provide diffusion pathways are less prevalent in uncollimated TiN. Junction spiking and leakage which is promoted by such diffusion pathways between the local interconnect and an adjacent junction may also be reduced.

The present invention contemplates the formation of a local interconnect across a semiconductor substrate. The local interconnect may extend a relatively short distance between, e.g., a gate conductor of one transistor and a source/drain junction of another transistor in the example provided. Formation of the local interconnect first involves etching away a region of an interlevel dielectric arranged upon the substrate to form a trench into which an ensuing local interconnect is to be formed. A photoresist masking layer may be patterned over regions of the dielectric exclusive of above the ensuing trench. An etch technique, for example, a plasma etch may be performed to remove the region of the dielectric not covered by the photoresist masking layer down to an etch stop layer, e.g. SiON, arranged upon the substrate and/or a transistor gate conductor patterned above a portion of the substrate. Thereafter, exposed portions of the etch stop layer may be selectively etched from the substrate and/or the gate conductor. A pre-existing junction of a transistor may be arranged within the substrate laterally adjacent a field oxide region, e.g., a trench isolation structure. Due to previous processing steps, a portion of the trench isolation structure may be removed below the upper surface of the junction such that a lateral sidewall of the adjacent junction is exposed. As such, the semiconductor topography may include a recess region bound by the lateral sidewall of the junction and the upper surface of the isolation structure. The recess region may have a relatively high aspect ratio and irregular shape.

After depositing a Ti layer across exposed surfaces of the semiconductor topography, a TiN layer is CVD deposited across the Ti layer. The pressure within the CVD reaction chamber may be reduced to approximately 1 to 3 Torr, and the semiconductor substrate may be heated to a temperature of approximately 200 to 450° C. prior to the deposition. A Ti[N(CH$_3$)$_2$]$_4$ entrained gas may be passed into the chamber at a rate of approximately 200 to 250 sccm, resulting in the deposition of a TiN layer. Unfortunately, the TiN layer may contain carbon and oxygen impurities which cause the resistivity of the TiN layer to be higher than desired. This problem can be minimized with further in situ processing steps.

Subsequently, N$_2$ may be passed into the chamber at a rate of approximately 150 to 250 sccm, and H$_2$ may be passed into the chamber at a rate of approximately 250 to 350 sccm. An in situ plasma treatment of the TiN may be performed by creating a plasma within the chamber such that N$_2$ and H$_2$ ions bombard the TiN layer. It is believed that the nitrogen species in the plasma replace carbon and oxygen impurities and nitrogen in the as-deposited TiN layer. Further, the hydrogen species in the plasma are believed to react with the carbon and oxygen impurities to produce volatile hydrocarbons and H$_2$O which can readily diffuse from the semiconductor topography into the ambient and be pumped away. As a result, the resistivity of the TiN layer is decreased. This plasma treatment may cause a 40% to 50% reduction in the thickness of the as-deposited TiN layer. Therefore, the TiN deposition and plasma treatment may be repeated until the desired TiN thickness has been reached. Subsequently, a material having a resistivity lower than TiN but higher than that of a global interconnect, preferably W, may be deposited upon the TiN layer within the trench to a level above the upper surface of the dielectric. The excess surface Ti, TiN, and W may be removed by, for example, chemical mechanical polishing the upper surface of the semiconductor topography down to a level below or commensurate with the upper surface of the interlevel dielectric. In this manner, a local interconnect is formed within the trench and the recess region.

BRIEF DESCRIPTION OF THE DRAWINGS

Other objects and advantages of the invention will become apparent upon reading the following detailed description and upon reference to the accompanying drawings in which:

FIG. 2 is a partial top plan view of a semiconductor topography having a local interconnect which couples a gate conductor of one transistor to a junction of another transistor, according to a conventional design;

FIG. 3a is a cross-sectional view along plane A—A of the semiconductor topography depicted in FIG. 2, wherein a Ti layer and a TiN layer which are formed by PVD are arranged at the periphery of a local interconnect comprising a W fill material;

FIG. 3b is a detailed view along section 46 of FIG. 3a, wherein the Ti layer and TiN are not conformally arranged across the surfaces of a narrow recessed region of the semiconductor topography and a void exists in the W fill material;

DETAILED DESCRIPTION OF THE INVENTION

Figure 1:
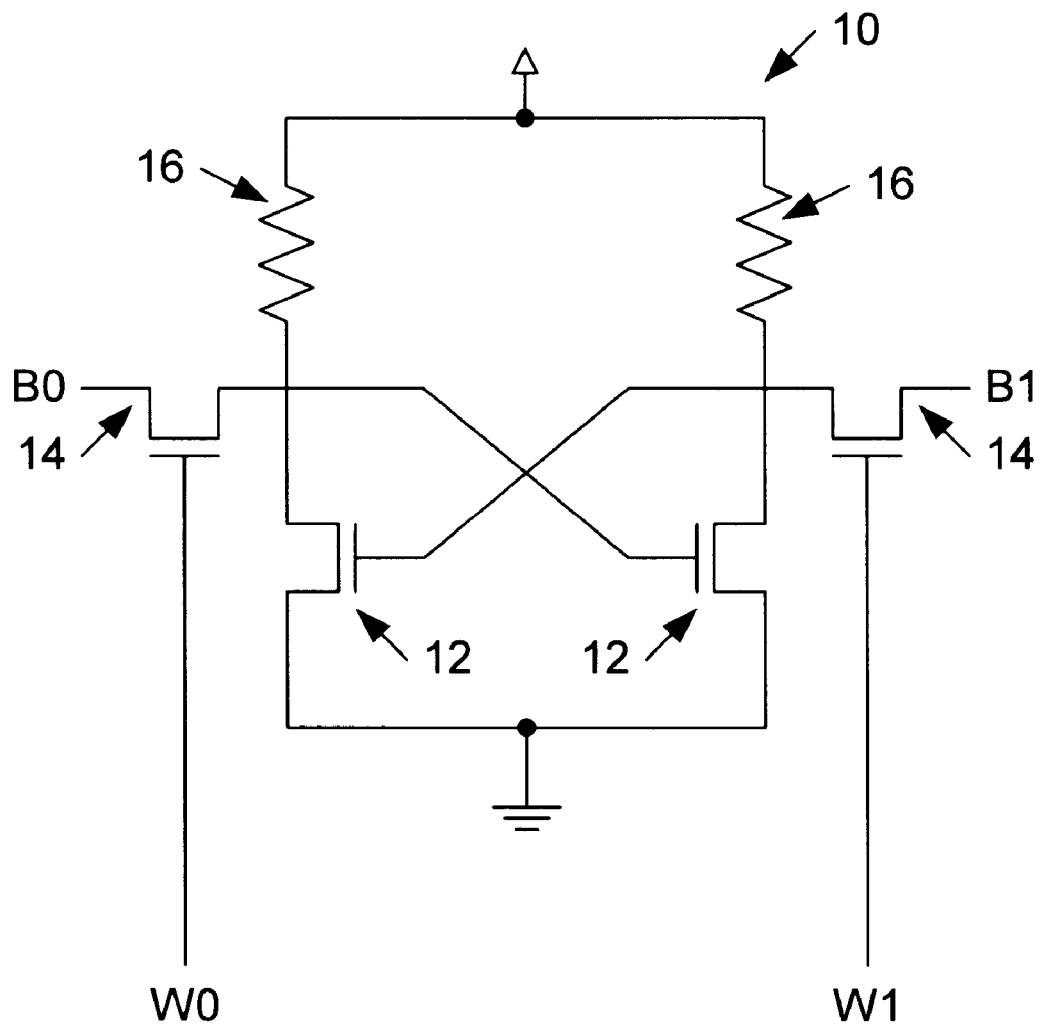
FIG. 1 is a circuit diagram of a static random access memory (SRAM) cell employing local interconnect according to a conventional design.
Figure 4:
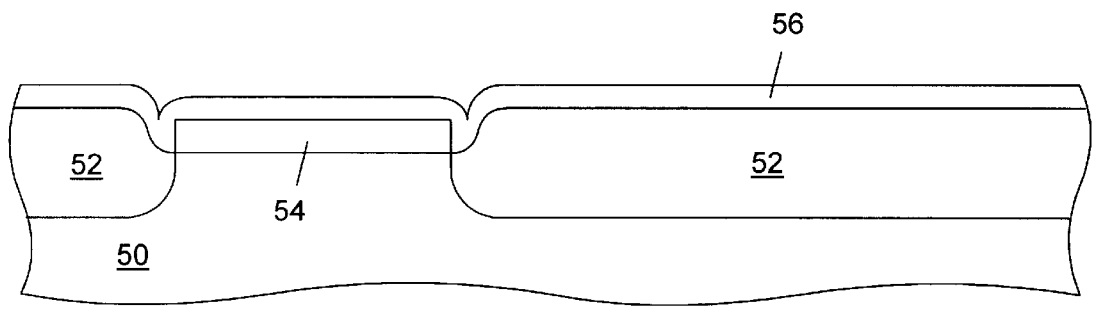
FIG. 4 is a partial cross-sectional view of a semiconductor topography according to an embodiment of the present invention, wherein an etch stop layer which is substantially dissimilar from an ensuing interlevel dielectric is deposited across an active junction interposed between trench isolation structures.

Turning now to the drawings, FIG. 4 depicts a semiconductor substrate 50 comprising single crystalline silicon which is slightly doped with n-type or p-type species. A source/drain junction 54 comprising a dopant species opposite in type to those of bulk substrate 50 has been implanted into substrate 50. Source/drain junction 54 may be employed by a transistor formed upon and within substrate 50. Junction 54 is interposed between trench isolation structures 52 which have been formed within substrate 50 using the well-known shallow trench process. The silicon surface of junction 54 may have a silicide formed thereon (e.g., $TiSi_2$) from a reaction between a refractory metal and silicon. Trench isolation structures 52 electrically isolate junction 54 from other devices formed within substrate 50. A portion of each trench isolation structure 52 laterally adjacent junction 54 may be recessed below the upper surface of the junction and will hereinafter be called the "recessed region". The recessed region has a relatively narrow width, and hence a relatively high aspect ratio.

Figure 5:
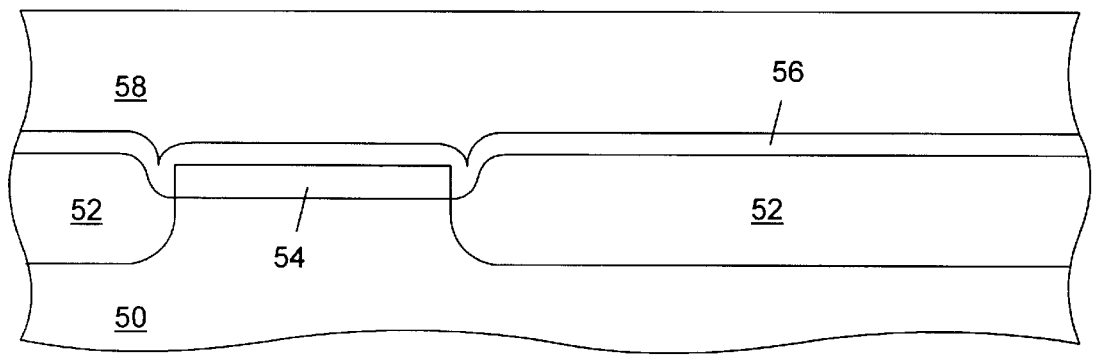
FIG. 5 is a cross-sectional view of the semiconductor topography, wherein an interlevel dielectric is deposited across the etch stop layer, subsequent to the step in FIG. 4.
Figure 6:
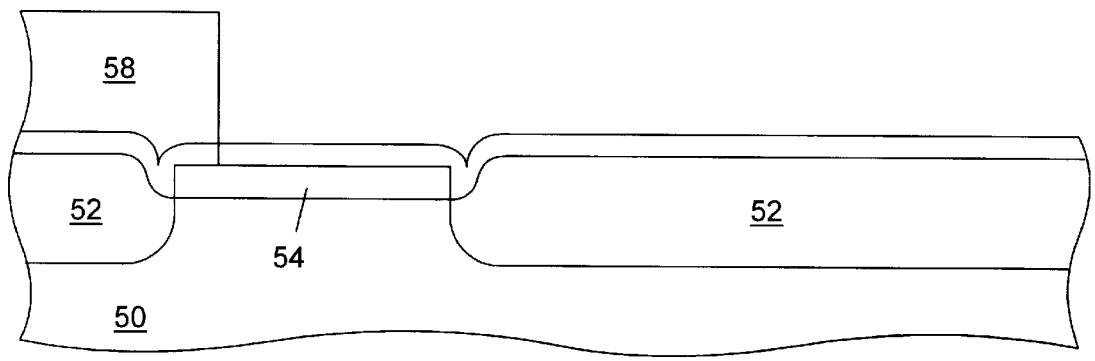
FIG. 6 is a cross-sectional view of the semiconductor topography, wherein a portion of the interlevel dielectric is etched to the etch stop layer to form a trench extending above the active junction and portions of the semiconductor substrate outside of the active junction, subsequent to the step in FIG. 5.
Figure 7:
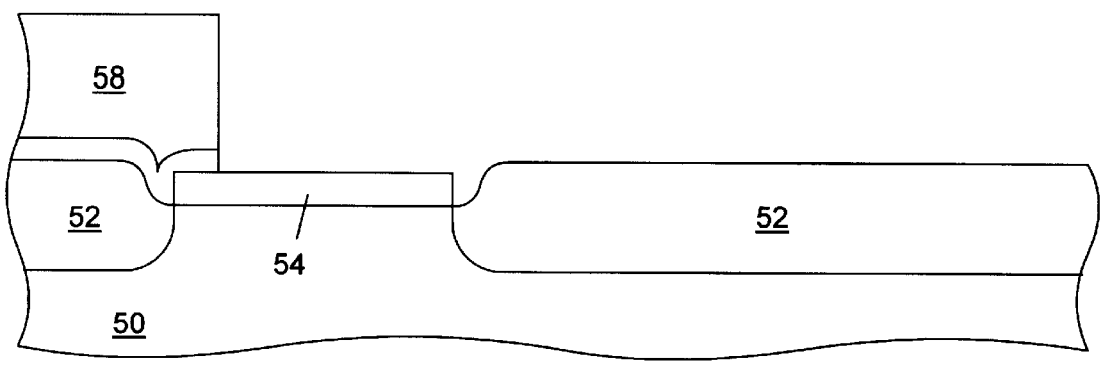
FIG. 7 is a cross-sectional view of the semiconductor topography, wherein a portion of the etch stop layer not covered by the interlevel dielectric is etched from the substrate and the trench isolation structures, subsequent to the step in FIG. 6.
Figure 8:
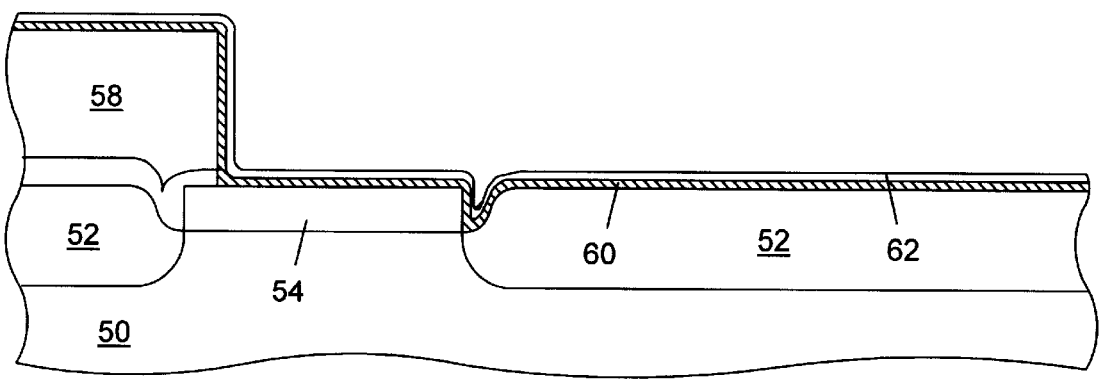
FIG. 8 is a cross-sectional view of the semiconductor topography, wherein Ti and TiN layers are CVD deposited across the exposed surfaces of the topography after performing an inert sputter etch to clean the surfaces, subsequent to the step in FIG. 4.

As shown in FIG. 4, an etch stop layer 56 comprising, e.g., SiON, is then CVD deposited across the semiconductor topography. Turning to FIG. 5, an interlevel dielectric 58 is CVD deposited across etch stop layer 56. Interlevel dielectric 58 may comprise an oxide- or glass-based material. Thereafter, as depicted in FIG. 6, a portion of interlevel dielectric 58 may be removed from etch stop layer 56. That portion of interlevel dielectric 58 is preferably removed using optical lithography and an etch technique which is highly selective to interlevel dielectric 58 relative to etch stop layer 56. As such, the etch step is terminated before portions of junction 54 and isolation structure 52 can be removed. Subsequently, as shown in FIG. 7, the exposed portion of etch stop layer 56 may be selectively etched from junction 54 and one trench isolation structure 52. Further, an oxide and contaminants which may have formed upon the surfaces underlying that exposed portion of etch stop layer 56 may be sputter etched to clean the surfaces.

Figure 9:
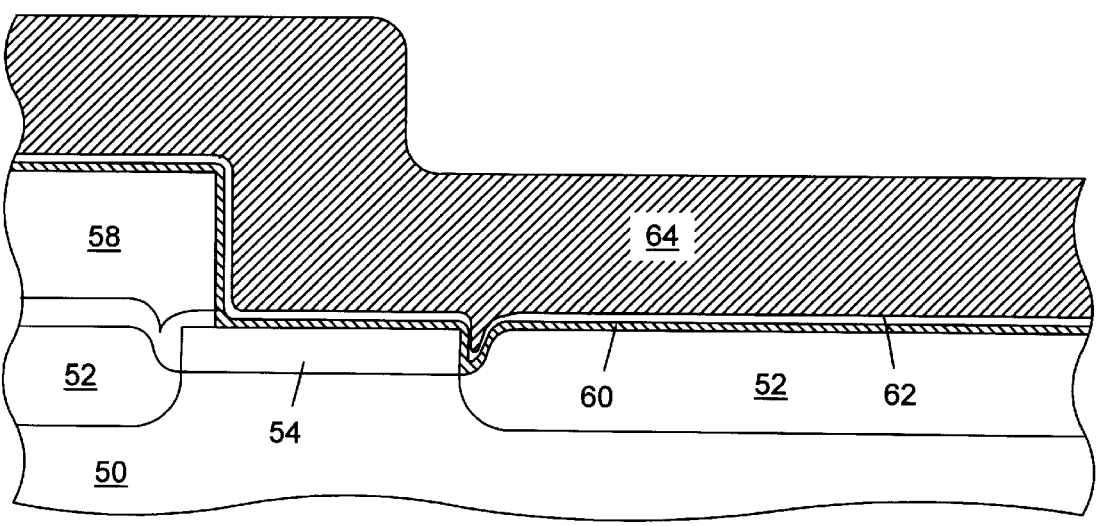
FIG. 9 is a cross-sectional view of the semiconductor topography, wherein W is deposited upon the TiN layer into the trench to a level spaced above the upper surface of the interlevel dielectric, subsequent to the step in FIG. 6.
Figure 10A:
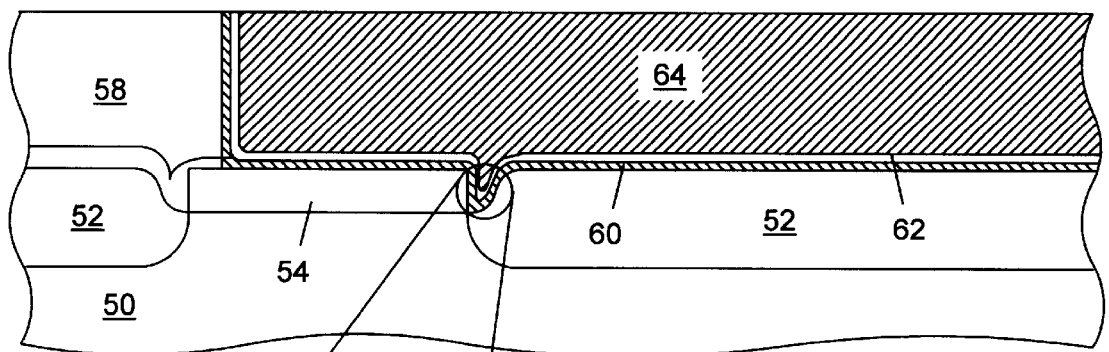
FIG. 10a is a cross-sectional view of the semiconductor topography, wherein the W, the Ti layer, and the TiN layer are removed down to a level approximately commensurate with the upper surface of the dielectric to form a local interconnect coupled to a junction, subsequent to the step in FIG. 9.
Figure 10B:
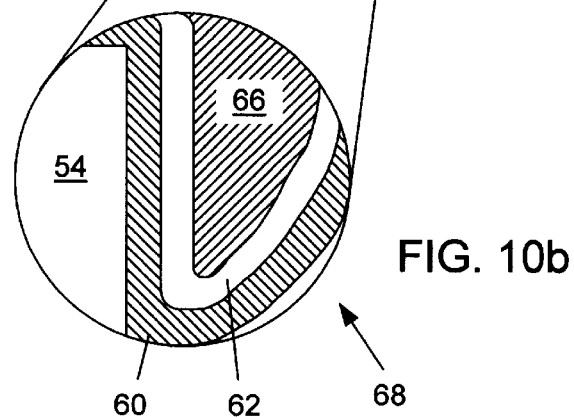
FIG. 10b is a detailed view along section 68 of FIG. 10a, wherein a Ti layer and a TiN layer are disposed conformally around the periphery of a recess region of the trench isolation structure, and a void-free tungsten fill material is arranged upon the TiN layer.

As depicted in FIG. 6, a titanium layer 60 may be deposited across exposed surfaces of the semiconductor topography using, e.g., a collimated PVD process. Thereafter, a TiN 62 is CVD deposited across titanium layer 60. The PVD process used to deposit TiN layer 62, which will be described later in detail, results in the thickness of TiN layer 62 being substantially uniform. The TiN layer 62 is substantially conformal even upon the lateral sidewall of junction 54 and the surface of trench isolation structure 52 which bound the narrow recessed region of the topography. FIG. 9 illustrates the CVD deposition of a conductive material 64, e.g., W, across the topography. The duration of the deposition is preferably terminated after the surface of conductive material 64 is spaced above the elevational level of the upper surface of TiN layer 62. As shown in FIG. 10a, conductive material 64, TiN layer 62, and Ti layer 60 may then be removed down to a level approximately commensurate with the upper surface of interlevel dielectric 58, thereby forming a local interconnect 66 electrically coupled to junction 54. Local interconnect 66 may extend a relatively short distance across substrate 50 to, e.g., a gate conductor of another transistor. FIG. 10b depicts a detailed view along section 68 of FIG. 10a. TiN layer 62 exhibits good step coverage upon surfaces which bound the recessed region adjacent junction 54. The thickness of the TiN layer 62 is relatively uniform and conformal. The TiN layer 62 is also not collimated or delaminated. Since the tungsten fill material of interconnect 66 adheres well to the TiN layer 62, it deposits upon all surfaces at an equal rate. Thus, the tungsten fill material arranged within the recessed region is free of voids and seams.

Figure 11:
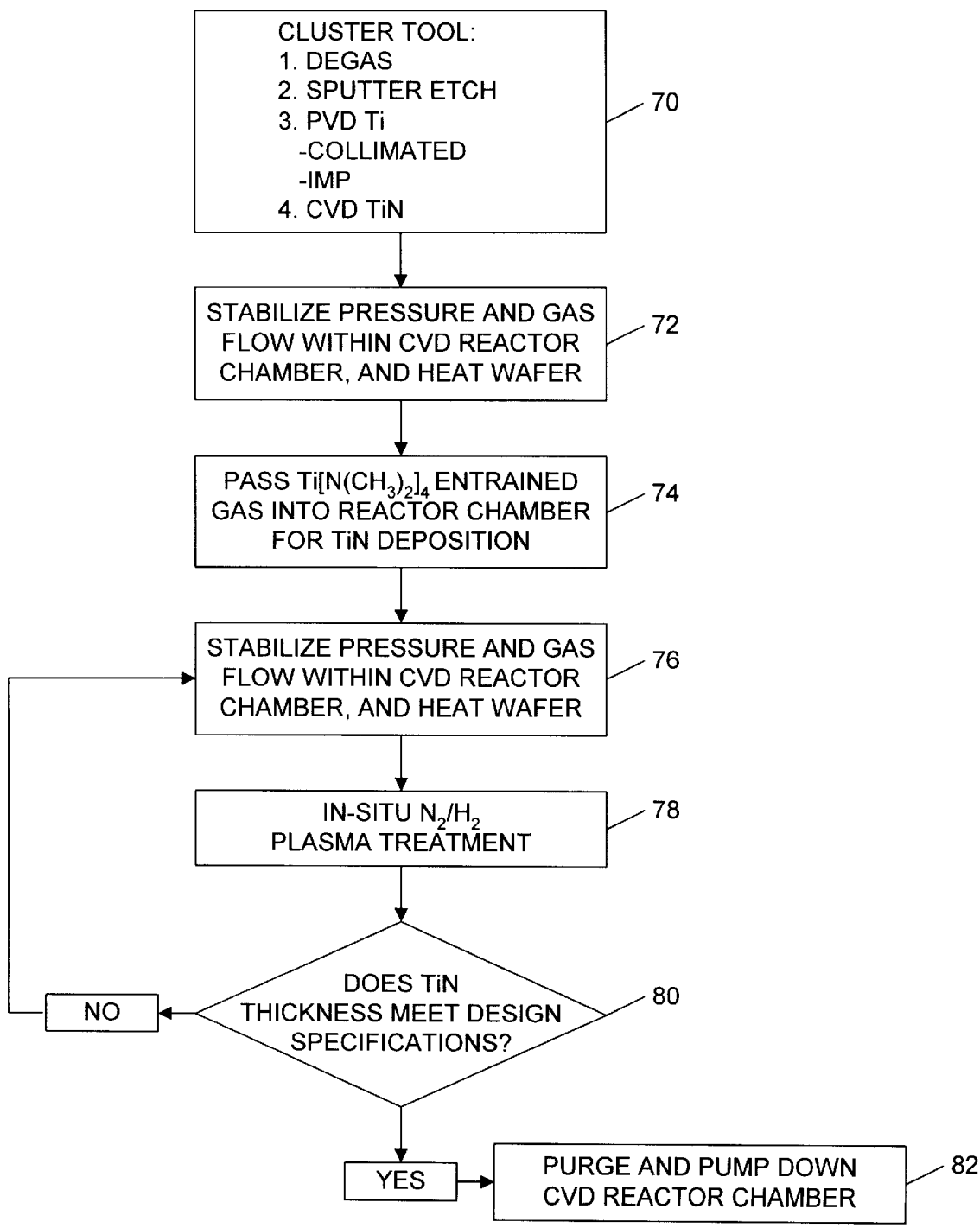
FIG. 11 is a process flow diagram demonstrating the steps involved in forming the TiN layer.

Turning to FIG. 11, a process flow diagram is provided to illustrate deposition in a metallization cluster tool 70. Tool 70 is used to deposit the TiN liner layer 62 without allowing ingress of undesirable ambient immediately prior to, during, and immediately after TiN deposition. Tool 70 includes a sputter etch reactor and a PVD reactor. After the wafer on which the semiconductor topography is formed is positioned within the cluster tool 70, all gas is removed from within the tool. The topological surface of the semiconductor topography is sputter etched to remove any contaminants. Titanium is PVD deposited across the topological surface, followed by another sputter etch to remove contaminants, including oxide, from the titanium covered surfaces. The semiconductor topography is then placed in a CVD reaction chamber associated with the cluster tool for the TiN deposition.

As shown by reference numeral 72, the pressure within the CVD reaction chamber is stabilized at about 1 to 3 Torr while the topography is heated to a temperature of approximately 200 to 450° C. in preparation for the TiN deposition. More preferably, the temperature of the topography is decreased to about 350 to 400° C., and the chamber pressure is reduced to about 1.3 to 1.7 Torr. These process parameters may be varied to control the properties of the deposited TiN. It is believed that increasing the deposition pressure as well as the temperature will lead to a drop in the resistivity of the resulting TiN layer. However, using a high temperature deposition is believed to lead to poor step coverage of the TiN. Concurrent with the heating of the semiconductor topography and the reduction of pressure within the reaction chamber, $N_2$ and He may be passed into the reaction chamber at a flow rate of about 250 to 350 sccm and 225 to 325 sccm, respectively. While the flow rate of $N_2$ appears to have little effect on the properties of the later deposited TiN, increasing the flow rate of He is believed to lead to a decrease in the resistivity of the TiN. A $Ti[N(CH_3)_2]_4$ entrained gas may then be passed into the reaction chamber using He as the carrier gas, as presented by reference numeral 74. The flow rate of the He carrier gas may be between about 200 and 250 sccm. As a result, CVD deposition of TiN upon the semiconductor topography occurs. It is believed that increasing the flow rate of the carrier gas can cause the resistivity and the thickness of the TiN layer to increase. The TiN layer 62 which was formed by CVD from a metal organic ($Ti[N(CH_3)_2]_4$) source exhibits good step coverage upon the sidewalls and base of the contact. The thickness of the TiN layer 62 at the periphery of the contact is relatively uniform and conformal. The TiN layer 62 is also not collimated or delaminated.

After the TiN deposition is completed, an in-situ $N_2/H_2$ plasma treatment may be performed on the TiN. Reference numeral 76 illustrates that the plasma treatment may involve pumping the chamber down to a pressure of about 1.2 to 1.5 Torr and heating the semiconductor topography to a temperature of about 380 to 420° C. It is believed that decreasing the plasma treatment pressure correlates to a reduction in the resistivity and the thickness of the TiN layer. The plasma treatment further involves passing $N_2$ at a flow rate of about 150 to 250 sccm and $H_2$ at a flow rate of about 250 to 350 sccm into the reaction chamber. As presented by reference numeral 78, a plasma is then formed in the chamber by applying a radio-frequency electric field to the gas therein. As a result ions of the $N_2$ and $H_2$ bombard the surface of the TiN layer. Increasing the flow rate of $N_2$ is believed to lead to a decrease in the resistivity and the thickness of the TiN. Increasing the flow rate of $H_2$ is believed to result in a slight increase in the resistivity of the TiN and an increase in the thickness of the TiN.

It is postulated that the nitrogen replaces carbon impurities with nitrogen in the TiN layer and that the hydrogen reacts with carbon and oxygen impurities to produce volatile hydrocarbons and moisture. Whatever the mechanism, a drop in the sheet resistance of the TiN layer seems to occur. Further, the thickness of the TiN layer may be reduced up to 40% to 50%. Therefore, the deposition and plasma treatment may be repeated as many times as necessary to achieve the desired thickness of the TiN layer. As shown by reference numeral 80, after the in-situ $N_2/H_2$ is performed, one may determine if the TiN layer thickness meets design specifications. If the thickness is not acceptable, the steps presented by reference numerals 76 and 78 may be repeated until the desired thickness is reached. By repeating the deposition and plasma steps, individual layers of TiN are present on the wafer which may lead to improved barrier properties. If the thickness is sufficient then the step represented by reference numeral 80 may be followed. The reaction chamber may be pumped down and purged to remove impurities therefrom prior to the next process step.

It will be appreciated to those skilled in the art having the benefit of this disclosure that this invention is believed to provide a method for forming a local interconnect which includes a CVD deposited TiN barrier at its perimeter. Further modifications and alternative embodiments of various aspects of the invention will be apparent to those skilled in the art in view of this description. The semiconductor topography described herein is only exemplary of the type of integrated circuit which may employ a local interconnect. Further, the process conditions of the TiN deposition and plasma treatment (e.g., flow rates, pressures, and temperatures) may be altered to achieve the desired properties of the TiN barrier layer. A more uniform thickness of TiN ensures a more uniform tungsten fill, better adhesion, and less susceptibility to spiking from the base through the junction. Absent substantial thinning and SiF formation, more optimal tungsten fill results in better contact conductivity. The present invention may be used in conjunction with device packages having different elements and configurations than the device package described herein. It is intended that the following claims be interpreted to embrace all such modifications and changes and, accordingly, the specification and drawings are to be regarded in an illustrative rather than a restrictive sense.

What is claimed is:

1. A method for forming an integrated circuit, comprising:
providing a dielectric disposed across a semiconductor substrate comprising an active area;
removing a portion of said dielectric to form a trench extending horizontally above said active area and portions of said semiconductor substrate outside of said active area;
depositing a layer of titanium into said trench across exposed surfaces of said substrate and said dielectric;
chemically-vapor depositing a titanium nitride barrier layer across said layer of titanium by placing said substrate into a reaction chamber comprising a tetrakis (dimethylamino)Ti entrained gas; and
forming a conductive material within said trench to form a local interconnect in electrical communication with said active area.

2. The method of claim 1, wherein said chemically-vapor depositing comprises positioning said semiconductor substrate in said reaction chamber and reducing a pressure within said reaction chamber to approximately 1 to 3 Torr prior to exposing said layer of titanium to said tetrakis (dimethylamino)Ti entrained gas.

3. The method of claim 2, wherein said chemically-vapor depositing comprises heating said semiconductor substrate to a temperature of approximately 200 to 450° C. concurrent with said reducing the pressure.

4. The method of claim 3, wherein said pressure is reduced to about 1.3 to 1.7 Torr, and wherein said temperature is about 350 to 400° C.

5. The method of claim 2, wherein said tetrakis (dimethylamino)Ti entrained gas is passed into said reaction chamber at a rate of approximately 200 to 250 sccm.

6. The method of claim 5, wherein said tetrakis (dimethylamino)Ti entrained gas comprises helium carrier gas.

7. The method of claim 1, wherein said conductive material comprises tungsten.

8. The method of claim 5, further comprising bombarding said titanium nitride barrier layer with a plasma comprising $N_2$ and $H_2$ ions prior to the step of forming said conductive material to lower the resistivity of said titanium nitride barrier layer and subsequent to said chemically-vapor depositing a titanium nitride barrier layer.

9. The method of claim 8, wherein said titanium nitride barrier layer comprises less than 10% carbon and oxygen contaminants, and contains amorphous grain structures.

10. The method of claim 8, further comprising repeating said chemically-vapor depositing a titanium nitride barrier layer and said bombarding said titanium nitride barrier layer prior to said forming a conductive material.

11. The method of claim 8, wherein said bombarding said titanium nitride barrier layer comprises passing $N_2$ into said reaction chamber at a rate of approximately 150 to 250 sccm concurrent with passing $H_2$ into said reaction chamber at a rate of approximately 250 sccm to 350 sccm.

12. The method of claim 8, wherein the titanium nitride barrier layer is substantially conformal as applied on a bottom and sidewall surfaces of the titanium-covered trench.

13. The method of claim 1, further comprising sputter etching said exposed surfaces prior to said depositing a layer of titanium.

14. A method for forming an integrated circuit, comprising:
providing a dielectric disposed across a semiconductor substrate comprising an active area, wherein a trench is defined within the dielectric that extends above said active area and portions of the semiconductor substrate outside of said active area; and chemically-vapor depositing a titanium nitride barrier layer within the trench, wherein said chemically-vapor depositing the titanium nitride barrier layer comprises passing a metal organic entrained gas into a reactor chamber in which the semiconductor substrate is disposed.

15. The method of claim 14, wherein said passing a metal organic entrained gas into a reactor chamber in which the semiconductor substrate is disposed comprises passing a tetrakis(dimethylamino)Ti entrained gas into the reaction chamber.

16. The method of claim 14, further comprising depositing a titanium layer into the trench across exposed surfaces of said substrate and said dielectric prior to said chemically-vapor depositing.

17. The method of claim 14, further comprising forming a conductive material within the trench to form a local interconnect in electrical communication within said active area.

18. The method of claim 17, wherein the conductive material comprises tungsten.

19. The method of claim 14, further comprising bombarding said titanium nitride barrier layer with a plasma comprising $N_2$ and $H_2$ ions subsequent to said chemically-vapor depositing a titanium nitride barrier layer.

20. The method of claim 14, wherein the titanium nitride barrier layer comprises less than 10% carbon and oxygen contaminants and contains amorphous grain structures.

* * * * *